(12) United States Patent
Kartashev

(10) Patent No.: US 9,842,983 B2
(45) Date of Patent: Dec. 12, 2017

(54) PIEZOELECTRIC MULTI-LAYER COMPONENT

(75) Inventor: Igor Kartashev, Deutschlandsberg (AT)

(73) Assignee: EPCOS AG, Munich (DE)

( * ) Notice: Subject to any disclaimer, the term of this patent is extended or adjusted under 35 U.S.C. 154(b) by 766 days.

(21) Appl. No.: 13/878,207

(22) PCT Filed: Oct. 7, 2011

(86) PCT No.: PCT/EP2011/006750
§ 371 (c)(1),
(2), (4) Date: Oct. 7, 2013

(87) PCT Pub. No.: WO2012/045867
PCT Pub. Date: Apr. 12, 2012

(65) Prior Publication Data
US 2014/0022043 A1    Jan. 23, 2014

(30) Foreign Application Priority Data
Oct. 7, 2010   (DE) ................. 10 2010 047 721

(51) Int. Cl.
*H01L 41/083* (2006.01)
*H01L 41/047* (2006.01)
*H01L 41/107* (2006.01)

(52) U.S. Cl.
CPC .................... *H01L 41/107* (2013.01)

(58) Field of Classification Search
CPC ................ H01L 41/107; H05B 41/2822
USPC ..................... 310/359, 366, 365
See application file for complete search history.

(56) References Cited

U.S. PATENT DOCUMENTS

| 3,562,792 | A |   | 2/1971 | Berlincourt et al. |
| 3,590,287 | A |   | 6/1971 | Berlincourt et al. |
| 5,118,982 | A | * | 6/1992 | Inoue ............. H01L 41/107 310/328 |
| 5,861,704 | A | * | 1/1999 | Kitami ........... H01L 41/107 310/357 |
| 6,278,625 | B1 | * | 8/2001 | Boyd ............. H01L 41/044 310/318 |
| 6,326,718 | B1 | * | 12/2001 | Boyd ............. H01L 41/107 310/359 |
| 6,366,006 | B1 |   | 4/2002 | Boyd |

(Continued)

FOREIGN PATENT DOCUMENTS

| CN | 1418380 A | 5/2003 |
| DE | 10109944 A1 | 10/2002 |

(Continued)

OTHER PUBLICATIONS

Ohnishi, O., et al., "Piezoelectric Ceramic Transformer Operating in Thickness Extensional Vibration Mode for Power Supply," IEEE Proceedings, Ultrasonics Symposium, vol. 1, Oct. 20-23, 1992, pp. 483-488.

(Continued)

*Primary Examiner* — Thomas Dougherty
(74) *Attorney, Agent, or Firm* — Slater Matsil, LLP

(57) ABSTRACT

A piezoelectric multi-layer component includes a piezoelectric main body, which has an inlet area and an outlet area. In the outlet area or in the inlet area at least two adjacent layers are polarized antiparallel to each other and at least two adjacent layers are polarized parallel to each other.

16 Claims, 1 Drawing Sheet

(56) References Cited

U.S. PATENT DOCUMENTS

| | | | |
|---|---|---|---|
| 6,413,443 B1 * | 7/2002 | Furukawa | C04B 35/491 |
| | | | 252/62.9 PZ |
| 6,577,044 B1 * | 6/2003 | Li | H01L 41/107 |
| | | | 310/366 |
| 6,707,235 B1 | 3/2004 | Brebol | |
| 7,367,095 B2 * | 5/2008 | Larson, III | H03H 9/132 |
| | | | 29/25.35 |
| 2002/0121177 A1 | 9/2002 | Sassmannshausen | |
| 2009/0218916 A1 * | 9/2009 | Florian | H01L 41/107 |
| | | | 310/366 |
| 2010/0026435 A1 | 2/2010 | Hoffmann et al. | |

FOREIGN PATENT DOCUMENTS

| | | | |
|---|---|---|---|
| DE | 102005015600 A1 | 10/2006 | |
| DE | 102006044184 A1 | 3/2008 | |
| DE | 102007009230 A1 | 8/2008 | |
| JP | 03-173484 A | 7/1991 | |
| JP | 9-275231 A * | 10/1997 | H01L 41/107 |
| JP | 11-317554 A | 11/1999 | |
| JP | 2004-259947 A | 9/2004 | |

OTHER PUBLICATIONS

Ohnishi, O., et al., "Piezoelectric Ceramic Transformer for Power Supply Operating in Thickness Extensional Vibration Mode," IEICE Trans. Fundamentals, vol. E77-A, No. 12, Dec. 12, 1994, pp. 2098-2105, Tokyo, Japan.

* cited by examiner

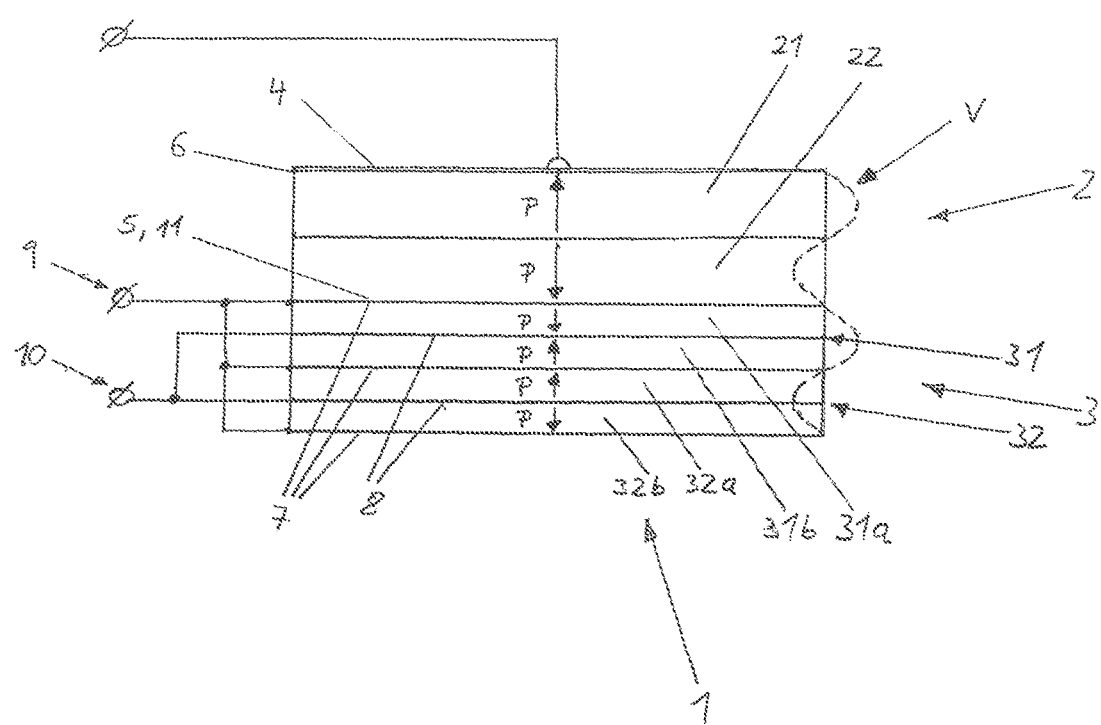

US 9,842,983 B2

PIEZOELECTRIC MULTI-LAYER COMPONENT

This patent application is a national phase filing under section 371 of PCT/EP2011/067570, filed Oct. 7, 2011, which claims the priority of German patent application 10 2010 047 721.4, filed Oct. 7, 2010, each of which is incorporated herein by reference in its entirety.

TECHNICAL FIELD

The invention relates to a piezoelectric multi-layer component, in particular a transformer.

BACKGROUND

Piezoelectric components which operate with thickness oscillations are suitable, in particular, for radio-frequency applications. Such piezoelectric components have operating frequencies of more than 500 kHz, which enable a further miniaturization of the electronic components.

One configuration for a piezoelectric component operating in the radio-frequency range is known from U.S. Pat. No. 6,707,235. In piezoelectric transformers which operate with thickness oscillations, the excitation of parasitic oscillation modes, in particular of the horizontal oscillation modes, impairs the efficiency of the arrangement. U.S. Pat. No. 6,707,235 proposes solving this problem by means of a piezoelectric main body of ring-shaped design. However, this specific ring-shaped configuration of the piezoelectric main body requires the use of complex technologies during the production of this component which are incompatible with the multi-layer technology which is already in use and which is usually used in the production of piezoelectric components. As a result, the production of such a component according to the principle proposed is complex and cost-intensive.

SUMMARY OF THE INVENTION

A piezoelectric component can be produced using multi-layer technology. The component effectively suppresses the excitation of parasitic oscillation modes.

In accordance with one preferred embodiment, a piezoelectric multi-layer component is proposed which comprises a main body composed of piezoelectric material and having an input region and an output region, wherein the output region or the input region has at least two adjacent plies, which are polarized antiparallel to one another, and at least two adjacent plies which are polarized parallel to one another.

In the present case, the term "plies" denotes sections of the multi-layer component. Preferably, a ply is a section which is arranged between two adjacent electrodes. Preferably, the plies comprise a piezoelectric material. Preferably, the piezoelectric material has a uniform direction of polarization in the ply. A ply in the input region is also designated hereinafter as "layer." A ply in the output region is also designated hereinafter as "partial layer."

In the present case, the term "layer" is preferably used for individual sections of the multi-layer component which all have the same thickness, which preferably amounts to half a wavelength of a harmonic oscillation of the main body. A layer can have a plurality of "partial layers." If a layer has a plurality of partial layers, then each of the partial layers is thinner than the layer.

The excitation of parasitic oscillation nodes is effectively damped by virtue of the specific type of polarization of the plies, in particular of partial layers of the output region. The piezoelectric component can be produced according to the proven multi-layer technology and thus cost-effectively. The damping of the parasitic oscillation modes leads to an increased efficiency of the piezoelectric component. The dependent claims respectively relate to developments and configurations.

In one embodiment, the input region comprises at least two plies situated one above the other and having an apparitely directed polarization substantially perpendicular to the top side of the main body.

In one embodiment, the plies in the output region have a smaller thickness than the plies in the input region.

In one embodiment, the piezoelectric multi-layer component has a first primary electrode, which is arranged above the input region parallel to a top side of the main body, a second primary electrode which is arranged below the input region parallel to the first primary electrode, and first and second secondary electrodes, which are arranged at least partly in the interior of the output region of the main body parallel to the first primary electrode.

The piezoelectric multi-layer component utilizes both the direct and the inverse piezoelectric effect.

The inverse piezoelectric effect is understood to mean that the piezoelectric ceramic experiences a deformation when an electric field is applied parallel or antiparallel or else at an angle with respect to the direction of polarization.

The direct piezoelectric effect is understood to mean that a voltage drop occurs in the main body when deformations occur.

The input region and the output region of the piezoelectric component are mechanically coupled to one another via the different layers of the piezoelectric main body. An electrical input signal is preferably converted into mechanical thickness oscillations of the main body in the input region of the piezoelectric multi-layer component. On account of the mechanical coupling of the input region and of the output region, both parts are affected by the mechanical thickness oscillation. The conversion of the electrical energy into the mechanical energy is effected on the basis of the inverse piezoelectric effect. In the output region, the mechanical thickness oscillations are preferably converted back into an electrical signal on the basis of the direct piezoelectric effect.

A mechanical deformation of the main body is caused by a voltage being applied to the first and second primary electrodes. An electrical voltage can then be tapped off at the first and second secondary electrodes as a result of the deformation of the main body.

In the case where an AC voltage is applied to the first and second primary electrodes, a periodically recurring deformation of the main body can be produced. This periodically recurring deformation of the main body can in turn cause a periodically changing voltage in the first and second secondary electrodes. What can be achieved by means of suitable arrangement of the first and second primary electrodes and of the first and second secondary electrodes is that the output voltage is different from the input voltage. A transformer having a transformation ratio corresponding to the ratio of the voltages is obtained in this case.

A deflection of the main body is effected if a voltage is applied to the input region of the piezoelectric multi-layer component. Deflection is understood to mean a contraction or dilation of the main body. In principle, thickness oscillations, horizontal oscillations and bending oscillations can occur in this case. A vertical deflection of the main body occurs in the case of thickness oscillations.

The piezoelectric multi-layer component is preferably designed for radio-frequency applications. Since, preferably, the thickness of the layers is significantly smaller than the length thereof, the frequency of the fundamental oscillation in the case of thickness oscillations is higher than that of the fundamental oscillation in the case of horizontal oscillations. A higher harmonic of the horizontal fundamental oscillation can be approximately at the frequency of the useful thickness oscillation. This harmonic of the horizontal fundamental oscillation constitutes a parasitic oscillation node which can be damped by the specified polarization of the different layers in the input and output regions.

In one embodiment, the piezoelectric multi-layer component comprises a main body comprising a PZT ceramic (PZT=lead zirconate titanate) as piezoelectric material. In particular, lead-free materials can also be used.

In one development, the output region has at least two layers situated one above another and each comprising at least two partial layers situated one above another, wherein the at least two partial layers of a layer are preferably polarized substantially perpendicular to the top side of the main body, and wherein the at least two partial layers of the respective layer are preferably polarized antiparallel to one another.

In this development, adjacent partial layers of adjacent layers can in each case be polarized parallel to one another. Parasitic oscillation modes can be effectively damped by the alternating sequence of parallel- and antiparallel-polarized partial layers.

In a further embodiment, the piezoelectric multi-layer component additionally comprises a first and a second electrical contact. The first electrical contact is electrically coupled to the first secondary electrodes, and the second electrical contact is electrically coupled to the second secondary electrodes. With the aid of this specific coupling of the secondary electrodes in the output region, parasitic oscillation modes which are possibly still present and which have not been completely suppressed by the specific polarization of the partial layers can additionally be electrically compensated for. In one embodiment, some of the first and second secondary electrodes are arranged alternately between the individual partial layers. A portion of the first and second secondary electrodes can also be arranged above or below the output region.

A thickness of a layer in the input region and/or in the output region can amount to half a wavelength of a harmonic oscillation of the main body.

The partial layers of the at least two layers situated one above another in the output region can have a uniform thickness.

In one exemplary embodiment the second primary electrodes and one of the first secondary electrodes form a common electrode. The common electrode is arranged in between the input region and the output region parallel to the first primary electrode and thus also mechanically couples the two regions. In this exemplary embodiment an input voltage is applied to the first primary electrode and to the common electrode. The thickness oscillations caused by the input voltage are mechanically transmitted into the output region and on account of the direct piezoelectric effect generate a voltage drop between the common electrode and the second electrical contact.

In an alternative embodiment, an insulation layer is arranged between the input region and the output region. Said insulation layer extends parallel to the top side of the main body and can comprise, in particular, organic or inorganic material. The input region and the output region are mechanically connected to one another and electrically isolated from one another by the insulation layer.

In accordance with one preferred embodiment, a piezoelectric multi-layer component, in particular a transformer, comprises: includes a main body composed of piezoelectric material and having an input region and an output region. The input region is arranged above the output region. A first primary electrode is arranged above the input region parallel to a top side of the main body. A second primary electrode is arranged below the input region parallel to the first primary electrode. First and second secondary electrodes are arranged at least partly in the interior of the output region of the main body parallel to the first primary electrode. The input region comprises at least two plies which are situated one above another and which have an oppositely directed polarization substantially perpendicular to the top side of the main body. The output region has at least two layers situated one above another and each comprising at least two partial layers situated one above another. The partial layers of the respective partial layers are polarized substantially perpendicular to the top side of the main body. The at least two partial layers of the respective layer are polarized antiparallel to one another.

In accordance with one preferred embodiment, a piezoelectric multi-layer component comprises a main body composed of piezoelectric material, a first and a second primary electrode and first and second secondary electrodes. The main body has am input region and an output region, wherein the input region is arranged above the output region. The input region comprises at least two layers which are situated one above another and are polarized in an oppositely directed manner and substantially perpendicular to a top side of the main body. The output region has at least two layers situated one above another and each comprising at least two partial layers situated one above another. The at least two partial layers of the respective layer are polarized antiparallel to one another and substantially perpendicular to the top side of the main body.

Another aspect of the invention relates to a method for operating a piezoelectric multi-layer component according to at least one of the exemplary embodiments described above.

This method comprises operating the piezoelectric multi-layer component at a frequency corresponding to a harmonic oscillation, in particular a fourth harmonic oscillation, of the fundamental oscillation of the main body. In conjunction with the above-described specific dimensions of the layers and partial layers of the main body, the piezoelectric multi-layer component is thus operated at a frequency at which a standing wave of a thickness oscillation forms. Parasitic oscillation modes that occur, in particular horizontal oscillations and bending oscillations, can be effectively damped by means of the antiparallel and parallel polarization of the layers or partial layers as described in the exemplary embodiments above and by means of the described coupling of the first and second secondary electrodes. The efficiency of the piezoelectric multi-layer component is thereby increased.

BRIEF DESCRIPTION OF THE DRAWINGS

The invention is explained in greater detail below on the basis of an exemplary embodiment with reference to FIG. 1.

FIG. 1 shows an embodiment of the piezoelectric multi-layer component.

The exemplary embodiment is illustrated schematically in FIG. 1, wherein individual elements are omitted for reasons of clarity. It goes without saying that a person skilled in the art can supplement individual aspects.

DETAILED DESCRIPTION OF ILLUSTRATIVE EMBODIMENTS

FIG. 1 shows a piezoelectric multi-layer component operating with thickness oscillations and having a main body 1 in a cross section.

The main body 1 composed of piezoelectric material comprises an input region 2 and an output region 3, which is arranged below the input region 2. A first primary electrode 4 is applied above the input region 2 parallel to the top side 6 of the main body 1. A second primary electrode 5 is situated below the input region 2, and is embodied parallel to the first primary electrode 4. Furthermore, the piezoelectric multi-layer component comprises first and secondary electrodes 7, which are arranged at least partly in the interior of the output region 3 of the main body 1 parallel to the first primary electrode 4. In the exemplary embodiment shown in FIG. 1, one of the first secondary electrodes 7 is electrically coupled to the second primary electrode 5 and forms a common electrode 11.

In an exemplary embodiment which is not shown, the second primary electrode 5 and one of the first secondary electrodes 7 can be designed separately, i.e., without electrical coupling. In this exemplary embodiment, an insulation layer, in particular composed of organic or inorganic material, can be arranged between the input region 2 and the output region 3. The insulation layer can be a passivation layer composed of an arbitrary dielectric material such as, for example, glass, silicon dioxide, organic coating or ceramic. The input region 2 is electrically isolated from the output region 3 by the insulation layer.

The exemplary embodiment from FIG. 1 furthermore comprises second secondary electrodes 8, which are situated in the interior of the output region 3 of the main body 1 parallel to the first primary electrode 4.

The input region 2 of the piezoelectric multi-layer component is constructed from two layers 21, 22 situated one above another and having an oppositely directed polarization P substantially perpendicular to the top side 6 of the main body 1. The layers 21, 22 of the input region are also designated as plies. A so-called "floating" electrode can be arranged between the layers 21, 22.

The output region 3 comprises two layers 31, 32 situated one above another. The layer 31 in the output region 3 is constructed from two partial layers 31*a*, 31*b* situated one above another. The partial layers 31*a*, 31*b* of the output region are also designated as plies. The layer 32 comprises the two partial layers 32*a*, 32*b* situated one above another. The partial layers 32*a*, 32*b* of the output region are also designated as plies. All of the partial layers are polarized perpendicular to the top side 6 of the main body 1. According to the invention, the two partial layers 31*a* and 31*b* of the layer 31 are polarized antiparallel to one another. The same applies to the partial layers 32*a* and 32*b* of the layer 32. Furthermore, the adjacent partial layers 31*b* and 32*a* of the adjacent layers 31 and 32 have a parallel polarization.

The first and second secondary electrodes 7, 8 are arranged alternately in the outer region 3 of the piezoelectric multi-layer component, partly between the individual partial layers 31*a*, 31*b*, 32*a*, 32*b*. A first electrical contact 9 is electrically coupled to the first secondary electrodes and to the common electrode 11 or the second primary electrode 5. A second electrical contact 10 electrically connects the second secondary electrodes 8.

When an input voltage is applied to the first primary electrode 4 and the common electrode 9, which acts as ground in this exemplary embodiment, a fourth harmonic oscillation of the fundamental oscillation of the main body 1 forms in the piezoelectric main body 1. As a result, an output voltage can then be tapped off between the first electrical contact 9 and the second electrical contact 10 owing to the direct piezoelectric effect.

In FIG. 1, the dashed line V indicates the distribution of nodes and antinodes for the fourth harmonic of the fundamental oscillation, wherein the fundamental oscillation is designated as the first harmonic. The number of half wavelengths within the main body 1 corresponds to the order of the harmonics.

FIG. 1 reveals that the thickness of a layer 21, 22, 31, 32 in the input region 2 or output region 3 in each case amounts to half a wavelength of the fourth harmonic oscillation of the main body 1. As a result of the uniform thickness of the partial layers 31*a*, 31*b*, 32*a*, 32*b* the second secondary electrodes 8 are situated exactly in the region of the antinodes of the fourth harmonic oscillation.

The propagation of parasitic oscillation modes is firstly damped by the oppositely directed polarization of the layers 21, 22 in the input region 2. When an input voltage is applied to the first primary electrode 4 and the common electrode 11, the layers 21 and 22 are deformed oppositely on account of their different polarizations. This in turn leads to a damping of the parasitic oscillation modes. The same applies to the layers 31 and 32 in the output region 3 of the piezoelectric multi-layer component.

Secondly, parasitic oscillation modes in the output region 3 are additionally electrically compensated for by the interconnection of the first and second secondary electrodes 7, 8 as outlined above.

The polarization of the layers or partial layers as outlined in the exemplary embodiment and the outlined electrical coupling of the first and second secondary electrodes effectively damp the propagation of parasitic oscillation modes, in particular of horizontal oscillations and bending oscillations. The efficiency of the piezoelectric multi-layer component is thus increased. The production of the component is cost-effective owing to the use of multi-layer technology.

The polarization of the piezoelectric multi-layer component is not limited to the polarizations of the layers or partial layers as shown in FIG. 1. In particular, different polarizations in the input region 2 can be combined with arbitrary polarizations in the output region 3. Thus, by way of example, the polarization of the layers 21 and 22 can be rotated and combined with the polarizations shown from the output region 3. Likewise, the polarization of the partial layer 31*a* can be directed toward the top side and the polarization of the partial layer 31*b* toward the underside of the piezoelectric multi-layer component. The suitable variations of the polarization of the layers or of the partial layers are evident to the person skilled in the art from the explanations outlined above.

In accordance with the method specified, the piezoelectric multi-layer component is operated at a frequency corresponding to a fourth harmonic oscillation of the fundamental oscillation of the main body.

By changing the structure of the piezoelectric multi-layer component, in particular by arranging additional layers in the input region 2 and/or in the output region 3, it is possible for the component also to be operated with other arbitrary harmonic oscillations. Alternatively, it is also possible for the thickness of the layers to be varied in order to operate the component with other harmonics or other frequencies. In general, the thickness of a layer corresponds to half the wavelength of the excited thickness oscillation.

The invention claimed is:

1. A piezoelectric multi-layer component comprising:
a main body comprising a piezoelectric material and having an input region and an output region,
wherein the output region and the input region each have a plurality of plies,
wherein the output region has at least two adjacent first plies that are polarized antiparallel to one another and at least two adjacent second plies that are polarized antiparallel to one another, wherein one of the first plies is adjacent to one of the second plies, wherein the one of the first plies is polarized parallel to the one of the second plies,
wherein the input region and the output region are arranged one on top of the other, and
wherein directions of polarization of the plurality of plies in the input region and in the output region are essentially perpendicular to a top surface of the main body.

2. The piezoelectric multi-layer component according to claim 1, wherein the plurality of plies in the output region have a smaller thickness than the plurality of plies in the input region.

3. The piezoelectric multi-layer component according to claim 1, further comprising:
a first primary electrode arranged above the input region parallel to the top surface of the main body;
a second primary electrode arranged below the input region parallel to the first primary electrode; and
first and second secondary electrodes arranged at least partly in an interior of the output region of the main body parallel to the first primary electrode.

4. The piezoelectric multi-layer component according to claim 3, further comprising:
a first electrical contact electrically coupled to the first secondary electrodes; and
a second electrical contact electrically coupled to the second secondary electrodes.

5. The piezoelectric multi-layer component according to claim 3, wherein some of the first and second secondary electrodes are arranged alternately between individual plies.

6. The piezoelectric multi-layer component according to claim 1, wherein a thickness of a ply in the input region amounts to half a wavelength of a harmonic oscillation of the main body.

7. The piezoelectric multi-layer component according to claim 6, wherein a thickness of a ply in the output region amounts to one quarter wavelength of a harmonic oscillation of the main body.

8. The piezoelectric multi-layer component according to claim 1, wherein a thickness of a ply in the output region amounts to one quarter wavelength of a harmonic oscillation of the main body.

9. The piezoelectric multi-layer component according to claim 1, wherein the plurality of plies in the output region have a uniform thickness.

10. The piezoelectric multi-layer component according to claim 3, wherein the second primary electrode and one of the first secondary electrodes form a common electrode formed between the input region and the output region parallel to the first primary electrode.

11. The piezoelectric multi-layer component according to claim 1, further comprising an insulation layer arranged between the input region and the output region.

12. The piezoelectric multi-layer component according to claim 11, wherein the insulation layer comprises an organic material.

13. The piezoelectric multi-layer component according to claim 11, wherein the insulation layer comprises an inorganic material.

14. The piezoelectric multi-layer component according to claim 1, wherein the piezoelectric multi-layer component comprises a transformer.

15. A method for operating a piezoelectric multi-layer component, the component comprising a main body comprising a piezoelectric material and having an input region and an output region, wherein the output region has at least two adjacent first plies that are polarized antiparallel to one another and at least two adjacent second plies that are polarized antiparallel to one another, wherein one of the first plies is adjacent to one of the second plies, wherein the one of the first plies is polarized parallel to the one of the second plies, and wherein the input region and the output region are arranged one on top of the other, and wherein directions of polarization of a plurality of plies in the input region and in the output region are essentially perpendicular to a top surface of the main body, the method comprising:
operating the piezoelectric multi-layer component at a frequency that corresponds to a harmonic oscillation of a fundamental oscillation of the main body.

16. The method according to claim 15, wherein the piezoelectric multi-layer component is operated at a 4th harmonic oscillation of the fundamental oscillation of the main body.

* * * * *

UNITED STATES PATENT AND TRADEMARK OFFICE
CERTIFICATE OF CORRECTION

PATENT NO. : 9,842,983 B2
APPLICATION NO. : 13/878207
DATED : December 12, 2017
INVENTOR(S) : Igor Kartashev It is certified that error appears in the above-identified patent and that said Letters Patent is hereby corrected as shown below:

On the Title Page

Item (86), Line 1, delete "PCT/EP2011/006750" and insert --PCT/EP2011/067570--.

Signed and Sealed this
Eighteenth Day of September, 2018

Andrei Iancu
*Director of the United States Patent and Trademark Office*